(12) United States Patent
Aquien et al.

(10) Patent No.: US 6,403,401 B1
(45) Date of Patent: Jun. 11, 2002

(54) HEAT SPREADER HOLE PIN 1 IDENTIFIER

(75) Inventors: Weddie Pacio Aquien, Sg; Loreto Y. Cantillep; Setho Sing Fee, both of Singapore, all of (SG)

(73) Assignee: St Assembly Test Services Pte Ltd, Singapore (SG)

( * ) Notice: Subject to any disclaimer, the term of this patent is extended or adjusted under 35 U.S.C. 154(b) by 0 days.

(21) Appl. No.: 09/639,679

(22) Filed: Aug. 14, 2000

(51) Int. Cl.[7] .......................... H01L 21/44; H01L 21/48; H01L 21/50
(52) U.S. Cl. ......................................... 438/122; 438/614
(58) Field of Search ................................ 257/675, 717; 438/122, 614, 118, 123

(56) References Cited

U.S. PATENT DOCUMENTS

| | | | |
|---|---|---|---|
| 5,768,774 A | 6/1998 | Wilson et al. | 29/840 |
| 5,869,883 A * | 2/1999 | Mehringer et al. | 257/667 |
| 5,869,891 A * | 2/1999 | Rostoker et al. | 257/712 |
| 5,895,967 A | 4/1999 | Stearns et al. | 257/691 |
| 5,977,626 A | 11/1999 | Wang et al. | 257/707 |
| 6,011,304 A | 1/2000 | Mertol | 257/706 |
| 2002/0000651 A1 * | 1/2002 | Takizawa et al. | 257/697 |

* cited by examiner

Primary Examiner—Phat X. Cao
Assistant Examiner—Thao X. Le
(74) Attorney, Agent, or Firm—George O. Saile; Stephen B. Ackerman

(57) ABSTRACT

A new method is provided to identify semiconductor devices whereby the invention provides for a shallow depression on the backside of the heat sink of the ball grid array package. This shallow depression or hole can be used for visual and optical inspection of the device orientation.

7 Claims, 5 Drawing Sheets

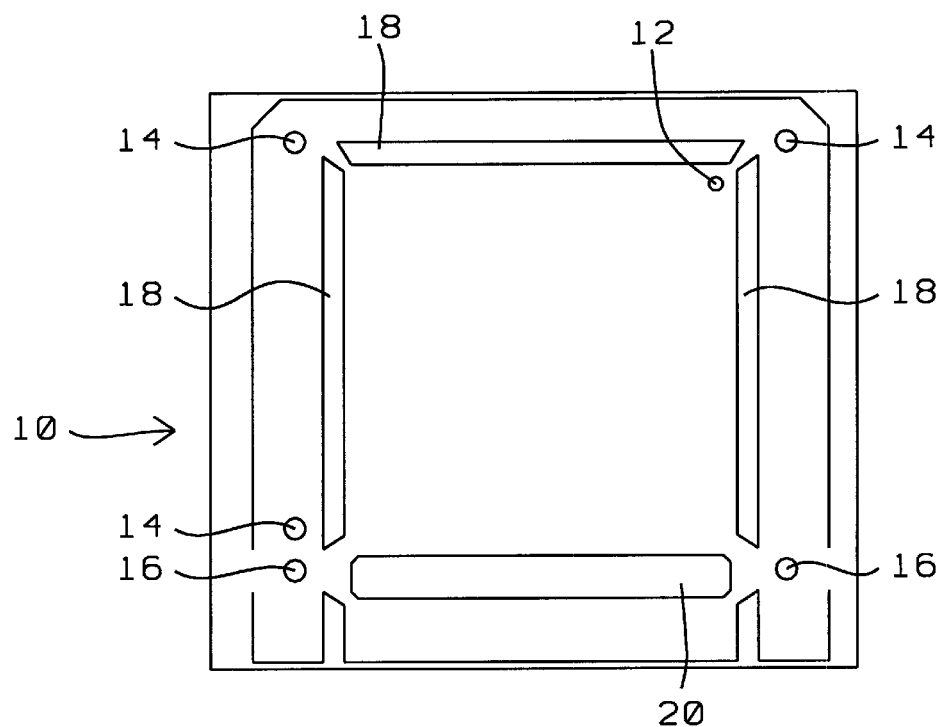
FIG. 1
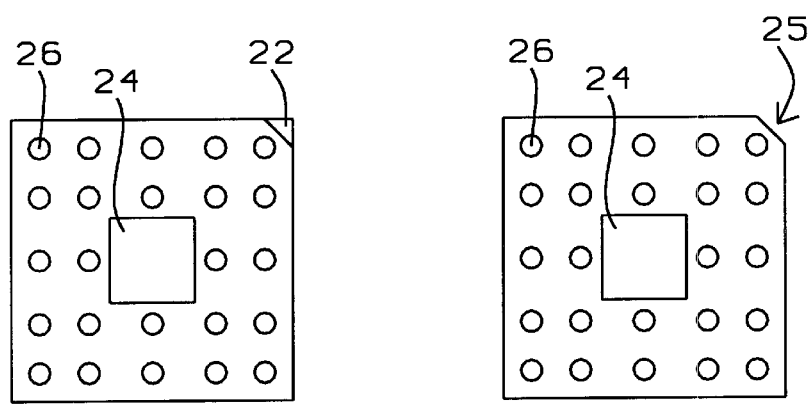
FIG. 2a - Prior Art
FIG. 2b - Prior Art

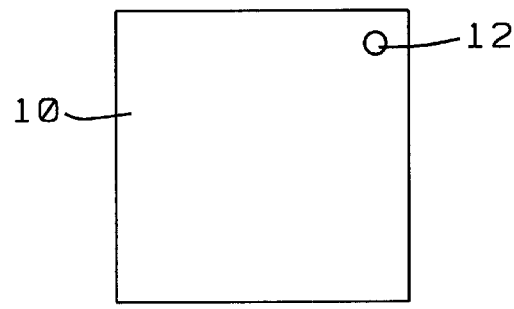
FIG. 3a – Prior Art
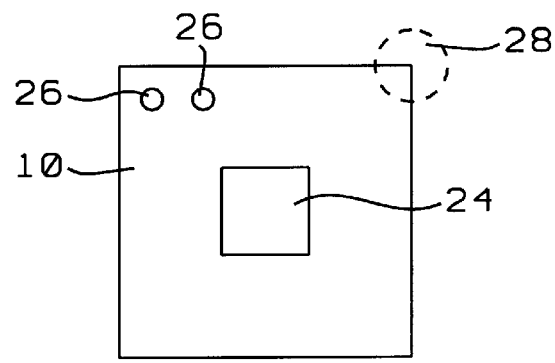
FIG. 3b – Prior Art
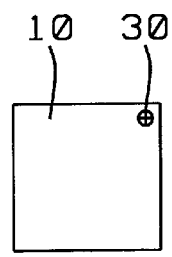 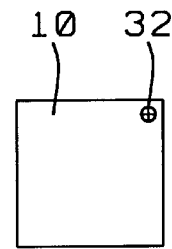
FIG. 3c – Prior Art
FIG. 3d – Prior Art

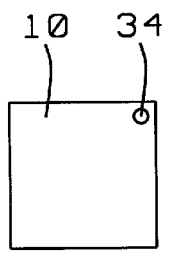 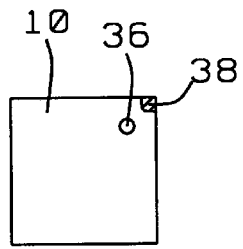
FIG. 3e – Prior Art    FIG. 3f – Prior Art
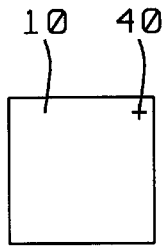
FIG. 3g – Prior Art
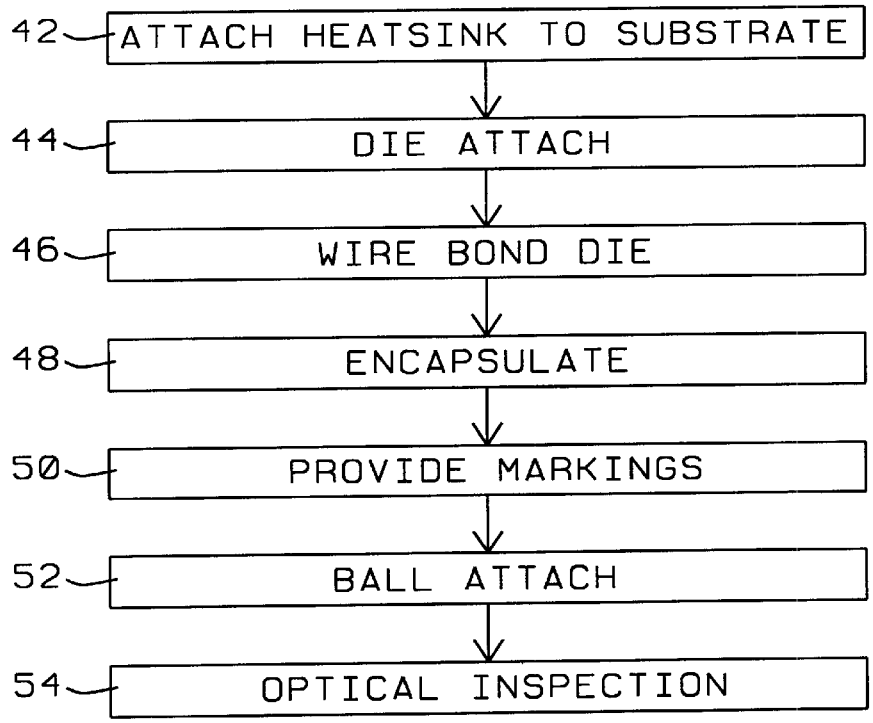
FIG. 4

HEAT SPREADER HOLE PIN 1 IDENTIFIER

BACKGROUND OF THE INVENTION (1) Field of the Invention

The invention relates to the fabrication of integrated circuit devices, and more particularly, to providing an opening that facilitates Flex Enhanced BGA (FEBCA) and Enhanced BGA (EBGA) device verification thus improving ease of device handling and reducing errors that are introduced by incorrect handling of FEBGA/EBGA devices.

(2) Description of the Prior Art

The creation of semiconductor devices does not only require the application of complex technologies with complex processing conditions and sequences but further requires methods of packaging the semiconductor devices once the devices have been created. Due to increased device density and increased device complexity, input/output capabilities of semiconductor devices may become a device performance constraint and therefore place increased requirements on the packaging of semiconductor devices.

Semiconductor device packages are known under a number of names and abbreviations and include laminated Ball Grid Array (BGA) devices that have over time evolved from lead frame packages such as the Dual In Line (DIL) and Quad Flat Package (QFP). BGA packages have shown to provide significant advantages that become especially important when the BGA approach is used to package an integrated circuit or die that has a high input/output pin count or where the semiconductor die is used in high-frequency applications. BGA packages can in addition be mounted using conventional surface mount and assembly techniques when these packages are mounted on a conventional Printed Circuit Board (PCB). The mounting of a semiconductor device typically requires the device, a substrate on which the device is to be mounted (such as a Printed Circuit Board), a method of connecting the die to the underlying substrate, which is typically referred to as first level interconnect and for which methods of wire bonding or Tape Automated Bond (TAB) or Controlled Collapse Chip Connection (C4) can be used, a method of connecting the substrate of the device to printed circuit cards or boards, also referred to as second level of interconnect that uses external metal pins or solder balls. Substrates typically contain ceramic or plastic materials, while semiconductor die can be encapsulated for reasons of protection whereby this encapsulation also encloses the first level of interconnect.

Surface mounted, high pin count integrated circuit packages have in the past been configured using Quad Flat Packs (QFP's) with various pin configurations. These packages have closely spaced leads for making electrical connections distributed along the four edges of the flat package. These packages have become limited by being confined to the edges of the flat package even though the pin to pin spacing is small. To address this limitation, a new package, the Ball Grid Array (BGA) package, is increasingly used. This package is less confined in its I/O pin distribution because the electrical I/O contact points are distributed over the entire bottom surface of the package. More contact points can thus be located on the bottom of the package, with spacing between the contact points that is larger than the spacing that is typically found in QFP's. These contacts are solder balls that facilitate flow soldering of the package onto a printed circuit board.

A Ball Grid Array (BGA) is an array of solderable balls placed on a chip carrier. The balls contact a printed circuit board in an array configuration where, after reheat, the balls connect the chip to the printed circuit board. BGA's are known with 40, 50 and 60 mil spacings in regular and staggered array patterns.

The packaging arrangements that are typically used for the packaging of semiconductor devices employ a number of different approaches whereby these approaches can be distinguished between methods of providing a (rigid or flexible) support structure on which the semiconductor device is mounted with interconnect lines provided on the surface of the support structure, methods of providing a chip-on-surface mounting technique whereby the supporting structure can contain laminated layers of interconnect lines that are used in combination with interconnect lines on the surface of the supporting structure and methods of providing laminated packages that use cavities for the mounting of the semiconductor devices. Where possible, the methods of packaging are designed such that automated packaging processes can be used for obvious reasons of costs incurred as part of the packaging process. In this respect, the supporting structure that uses a cavity for the mounting of the semiconductor device does not lend itself to automatic packaging processes since, for the various packaging approaches that have been highlighted, the semiconductor device must, after it has been packaged, as yet be encapsulated, which is a processing step that cannot readily be monitored using cavity based supporting structures.

For the typical mounting of a chip on the surface of a laminated substrate, whereby the substrate can be either ceramic (making the substrate rigid) or can contain an organic or plastic material (making the substrate flexible), electrical interconnect lines are formed in the laminated layers of the substrate using conventional methods of metal deposition and patterning that apply standard photolithographic methods and procedures. The various layer of the laminated substrate are insulated from each other using dielectric materials such as a polyimide that can be used to separate for instance metal power and ground planes in the substrate. Electrical connections between the layers of the laminated substrate are formed by conductive vias, the opening of the via is, after this opening has been formed, filled with a conductive material in order to establish the electrically conductive paths between the various layers. After the required interconnect patterns have in this manner been established in the laminated substrate, the semiconductor chip is positioned on the surface of the substrate and attached to the substrate by a suitable die attach material such as epoxy. This layer of epoxy serves not only to hold the semiconductor die in place but also serves as a heat transfer medium between the die and the substrate. The top surface of the semiconductor die is connected (wire bonded) to the conductive traces on the surface of the substrate, after which the die including the bonded wires can be encapsulated. Electrical interconnects must then be established between the substrate (to which the die is at this time connected) and the surrounding electrical circuits to which the substrate is connected. Electrical traces are also provided in the lower surface of the substrate, a solder mask is deposited over the bottom surface of the substrate, contact balls are positioned in alignment with the contact points in the lower surface of the substrate and re-flowed, connecting the contact balls with the electrical traces in the bottom surface of the substrate and completing the interconnects between the (surface mounted) semiconductor die and the contact balls of the supporting substrate. The method described above is a method of connecting a semiconductor device using wire bond techniques. In addition and as a substitute to the wire bond techniques, known connection techniques in the art such as flip-chip techniques can be applied to interconnect the semiconductor die.

Another important consideration in designing semiconductor packages is the aspect of heat dissipation, an aspect that becomes even more important for devices that operate at high operating speeds or at high levels of voltage. For the purpose of heat dissipation, a semiconductor device can be mounted on a heat sink whereby the heat dissipation can be enhanced by providing a low thermal resistivity path between the semiconductor device and the heat sink. Methods that are applied to conduct heat from the die to the heat sink and from the heat sink to the environment for further dissipation are well know in the art.

For all of the above indicated aspects of semiconductor device packaging and for other aspects that may not have been enumerated above, it is important that in a high speed, high throughput manufacturing environment semiconductor devices can be readily identified with respect to die surface and how, as a consequence, the device must be mounted in for instance a heat sink. Lack of fast and correct identification leads to misplaced and incorrectly placed devices, resulting in increased production costs. A method must therefore be provided that assures fast and correct identification of device surfaces, the method of the invention addresses this problem of device identification.

U.S. Pat. No. 51895,967 (Stearns et al.) shows a BGA with a stiffener and spreader.

U.S. Pat. No. 5,977,626 (Wang et al.) teaches a heat spreader for a PBGA.

U.S. Pat. No. 5,768,774 (Wilson et al.) shows a BGA package with a heat sink. However, this reference differs from the invention.

U.S. Pat. No. 6,011,304 (Mertol) shows a stiffer ring attachment p3 le and removable snap in heat spreader lid.

SUMMARY OF THE INVENTION

A principle objective of the invention is to provide a method that allows for easy and dependable identification of semiconductor device orientation.

Another objective of the invention is to prevent errors that are introduced due to incorrect device surface or orientation identification.

Yet another objective of the invention is to provide a method that simplifies the verification of semiconductor devices in a high speed, high throughput semiconductor manufacturing environment.

A still further objective of the invention is to provide a method of semiconductor device identification that has no negative effect on device throughput.

A still further objective of the invention is to provide a method of device identification that applies to both small and large devices and that is independent of the device I/O count.

In accordance with the objectives of the invention a new method is provided to identify semiconductor devices. Prior Art methods of device identification use a cutout on one side of the device or a chamfer (removed corner) of the device for this purpose. This method run into problems where packages with high I/O pin count are required since the space that is required for the chamfer may interfere with or limit the number of I/O pins that can be provided on the bottom of the package. For this reason, the invention provides for a shallow depression or hole on the backside of the heat sink of the package. This shallow depression can be used for visual and optical inspection of the device orientation.

BRIEF DESCRIPTION OF THE DRAWINGS

FIG. 1 shows a top view of an FEBGA/EBGA heat sink/stiffener that is presently used whereby the Pin ID location of the invention is highlighted.

FIGS. 2a–2b shows a top view of the ball side of a Prior Art FEBGA/EBGA device, highlighted in this view are the package ID markings, as follows:

FIG. 2a uses a copper trace for the device marker

FIG. 2b uses a chamfer for the device marker.

FIGS. 3a–3g shows a number of Prior Art markings that are typically provided on the ball side of the device, as follows:

FIG. 3a shows the backside view of the device, that is the side of the device that is opposite to the side of the device to which the contact balls are attached, the shallow depression of the invention is applied to this side of the device; device identification markings are typically applied to this side of a FEBGA/EBGA device.

FIG. 3b shows the ball side of the FEBGA/EBGA device of the invention whereby this side is provided with a conventional identifier mark.

FIGS. 3c through 3g shows different conventional marks that can be applied to the ball side of a FEBGA/EBGA device.

FIG. 4 shows a sequence of operations that is applied for the creation of a FEBGA/EBGA device whereby the identification mark of the invention is applied.

FIG. 6a shows a view of the conventional the chamfer and the contact ball that is closest to the chamfer.

FIG. 6b shows a top view of the FEBGA/EBGA device looking at the FEBGA/EBGA device from the ball side of the device, a full complement of BGA contact balls is shown in FIG. 6b.

FIG. 7a is a cross section of a FEBGA device where the device is mounted on the surface of a heat spreader, FIG. 7b is a cross section of a FEBGA device where the device is mounted in a cavity in a heat spreader, and FIG. 7c is a cross section of a EBGA device where the device is mounted on the surface of a heat spreader.

DESCRIPTION OF THE PREFERRED EMBODIMENTS

Figure 5:
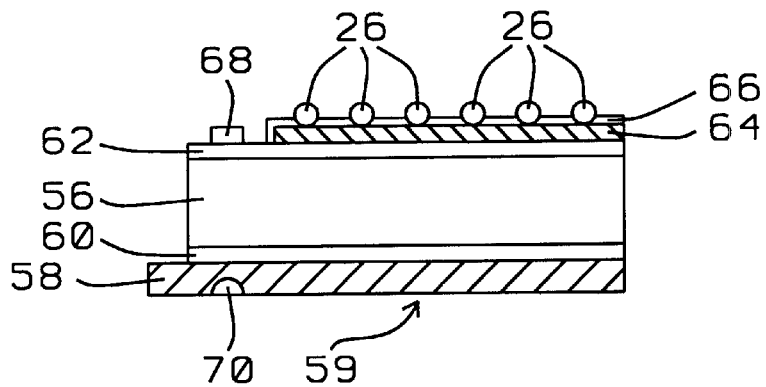
FIG. 5 shows a cross section of the FEBGA/EBGA heat sink with its adjacent components whereby the mark of the invention is provided in the heat sink.

Referring now specifically to FIG. 1, there is shown a top view of an FEBGA/EBGA heat sink/stiffener 10 as it is presently used whereby however the Pin ID location 12 of the invention is highlighted. It must be emphasized that the view of the heat sink 10 that is shown in FIG. 1 is the view of the side of the heat sink that is opposite to the side to which the contact balls of the FEBGA/EBGA device will be attached.

Further shown in FIG. 1 are a number of sub-features of the heat sink as follow:

14 are alignment openings that are used to align an individual heat sink during product assembly 16 are alignment openings that are used for alignment of an assemblage of heat sinks before these heat sinks are processed as individual heat sinks 18 are tension relieve slots that surround the body of the heat sink and that are meant to allow tension free and warpage free processing and separation of the heat sinks, and 20 are inter-heat sink slots that separate individual heat sinks and that in essence also provide tension relieve between adjacent heat sinks during the process of singulation of the heat sinks.

FIG. 2 shows the FEBGA/EBGA device identification method that is presently used. With identification is meant the step of identifying which side of the FEBGA/EBGA device is facing upwards, this identification is a manual process even though the identification can also be performed using for instance optical methods.

FIG. 2a uses a trace or line 22 that is provided in the surface of the (copper) heat sink to identify the position of the FEBGA/EBGA device. The location of the die 24 is highlighted, this die is mounted on the side that is shown in top view in FIG. 2a since the view of FIG. 2a is the ball side of the FEBGA/EBGA heatsink.

By using the copper trace 22 it is difficult to perform positive identification of which side of the FEBGA/EBGA is facing upwards since only after having located and after observing the copper trace can the method of identification be assured which side of the FEBGA/EBGA is being observed. Contact balls 26 have been highlighted for reasons of clarity.

FIG. 2b shows the present method of FEBGA/EBGA device identification by using a chamfer 25 that is provided in one of the corners of the FEBGA/EBGA heat sink. The problem that is encountered with the method of using a chamfer as FEBGA/EBGA device identification is that the usefulness of this method is device size dependent. The FEBGA/EBGA device is, as previously pointed out, used to increase device I/O count which means that a relatively large number of contact balls are distributed over the surface of the heat sink. This in turn means that any reduction in the size of the surface area of the FEBGA/EBGA device heat sink potentially effects the number of contact balls that can be used which is, from a FEBGA/EBGA device design standpoint, not acceptable. This results, for FEBGA/EBGA packages other than 27×27 mm packages, in a very small chamfer since again the chamfer surface area would limit the number of balls that can be applied for FEBGA/EBGA packages such as 31×31 mm, 35×35 mm, 40×40 mm up through 45×45 mm packages. In short: the approach that uses a chamfer for device identification is package-size dependent and is therefore not an approach that can be universally applied. This is further detailed under FIG. 6 below.

FIG. 3a shows the location where the mark of the invention is applied, FIGS. 3b through 3g show a number of conventional markings with their location that can be applied to the ball side of the substrate that is used for the marking of the invention.

FIG. 3a shows a view of the side that is opposite of the ball side of the device of a FEBGA/EBGA heat sink of the invention. The top side of the heat sink is the side on which the semiconductor device will be mounted, the bottom side of the heat sink by contrast is the side that is shown in FIG. 3a. The hole identifier 12 of the invention is not an opening that penetrates the heat sink but can be a depression in the surface of the heat sink. The opposite or ball side of the heat sink that is shown in FIG. 3a contains a heat 5ink identifier that consists of a geometric figure, several examples of the shape of this geometric figure that can be used for the heat sink identifier are shown in the following FIGS. 3b through 3f. This heat sink identifier is used not only to identify a particular side (surface) of the heat sink but also identifies the heat sink by type implying heat sink size, heat dissemination capabilities, material used for the heat sink (typically copper) and the like.

FIG. 3b shows the location 28 where the heat sink identifier is typically attached. FIG. 3b is a view of the ball side (the device side) of the heat sink.

FIG. 3c shows a triangular heat sink identifier 30.

FIG. 3d shows a circular (closed circle) heat sink identifier 32.

FIG. 3e shows a circular (open circle) heat sink identifier 34.

FIG. 3f shows a circular (closed circle) heat sink identifier 36 combined with a square heat sink identifier 38.

FIG. 3g shows a cross shaped heat sink identifier 40.

It is clear that the geometric shape of the heat sink identifier can take any known shape, a limitation might be that this identifier is readily recognized by optical means. This for automatic identification of the heat sink.

FIG. 4 shows a sequence of operations that are applied for the creation of a FEBGA/EBGA device whereby the identification mark of the invention is applied.

The process starts, FIG. 4, step 42, with the attachment of a heat sink for an individual FEBGA/EBGA device to the underlying FEBGA/EBGA device substrate. The heat sink and substrate are typically obtained by punching (removing) the heat sink/substrate from a strip of heat sinks/substrates.

The FEBGA/EBGA device is next (FIG. 4, step 44) attached using conventional methods to the substrate, using for instance an adhesive epoxy that further facilitates heat flow from the die to the underlying heat sink.

The device is then wire bonded to the contact pads that are provided in the surface of the substrate, thereby electrically connecting the FEBGA/EBGA device to the substrate, FIG. 4, step 46.

The die is encapsulated, FIG. 4, step 48. FEBGA/EBGA device markings are then provided to the package on the reverse side of the package, that is the side where the shallow identifier of the invention has been provided in the heatsink, FIG. 4, step 50.

The partially completed package is next provided with BGA contact balls, FIG. 4, step 52, which are attached on the solder mask and the underlying layer of copper interconnect lines.

As a final step the FEBGA/EBGA is optically inspected, FIG. 4, step 54.

FIG. 5 shows a cross section of the substrate and heat sink that are used for the packaging of FEBGA/EBGA devices. Highlighted in FIG. 5 are:

56, the FEBGA/EBGA device laminated substrate 58, the copper heat sink 59, a layer of epoxy that is coated on the surface of the heat sink 58

60, a layer of adhesive that is applied for the attachment of the FEBGA/EBGA device to the heat sink 62, a layer of adhesive that is applied for the attachment of the overlying layer of copper traces 64, copper traces to which the FEBGA/EBGA device is connected 66, a solder mask that is applied for the attachment of the BGA contact balls 68, the conventional identification mark that has been applied to the substrate, and 70, the hole identifier of the invention.

Figure 6A:
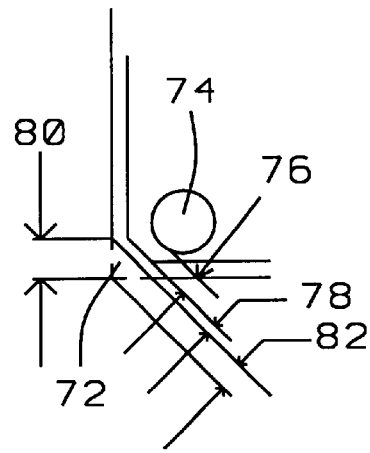
FIGS. 6a–6b shows a top view of the conventional chamfer provided in the heat sink of the FEBGA/EBGA device, as follows.

FIG. 6 shows a top view of the conventional chamfer 72 provided in the substrate of a FEBGA/EBGA device, as follows:

FIG. 6a shows a view of the conventional the chamfer 72 and the contact ball 74 that is closest to the chamfer 72. The dimensions that have been highlighted in FIG. 6a are for a typical chamfer/contact ball arrangement and are as follows:

dimension 76=0.150 mm dimension 78=0.150 mm.

dimension 80 varies and is dependent on package size, as follows: for a 27×27 package 80=0.2000 mm and as yet allows for the use of the chamfer 72. For FEBGA/EBGA device packages of increased size, from 31×31 mm up through 45×45 mm, the value of 80 decreases from 0.102 mm to 0.117 mm, leaving not enough room for a chamfer to be applied, or, if a chamfer were to be applied, the chamfer would be so small as to have no practical value for inspection purposes dimension 82 varies and is dependent on package size, as follows: for a 27×27 package 82=0.908 mm and as yet allows for the use of the chamfer 72. For FEBGA/EBGA device packages of increased size, from 31×31 mm up through 45×45 mm, the value of 82 decreases from 0.144 mm to 0.165 mm leaving not enough room for a chamfer to be applied, or, if a chamfer were to be applied, the chamfer would be so small as to have no practical value for inspection purposes.

Figure 6B:
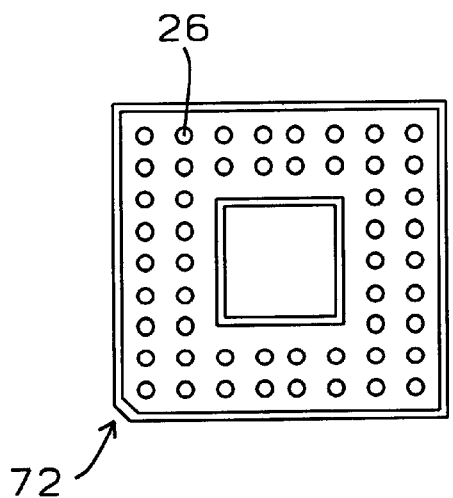

FIG. 6b shows a top view of the FEBGA/EBGA device looking at the FEBGA/EBGA device from the ball side of the device, a full complement of BGA contact balls is shown in FIG. 6a.

Figure 7A:
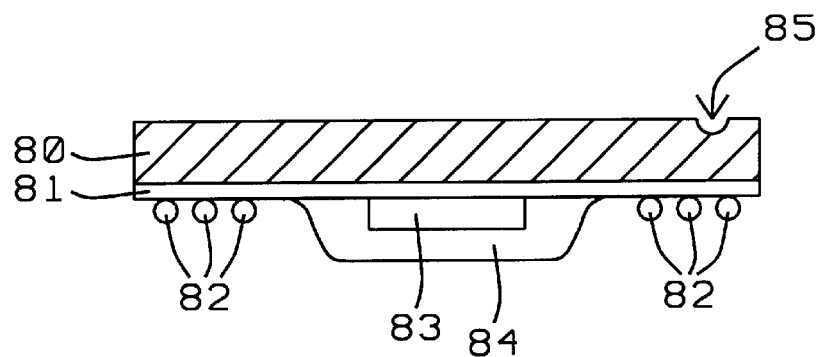
FIGS. 7a–7c shows three cross section of BGA devices that highlight the indentation or depression of the invention, as follows.

Referring now to FIG. 7a, there is shown a cross section of a FEBGA device where the device 83 is mounted on the surface of a heat spreader 80. The flex tape 81 provides the mechanical and electrical interface between the heat sink 80 and the device 83 with the contact balls 82. The device 83 is encapsulated in a plastic molding compound 84. Of key importance to the invention is the indentation or depression 85 that serves the previously highlight purpose of facilitating device orientation.

Figure 7B:
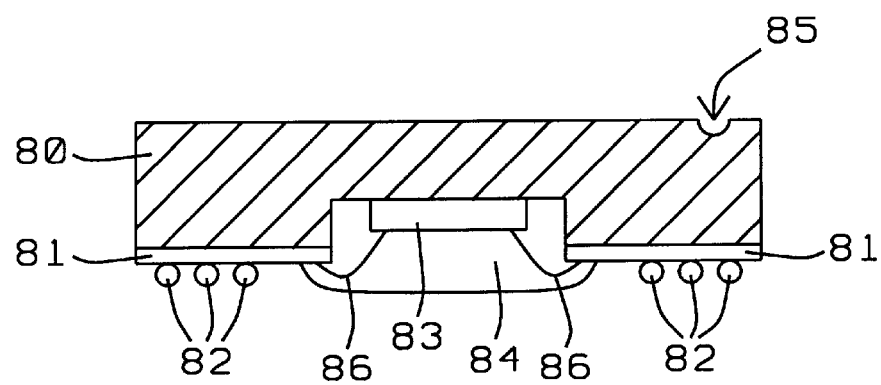

FIG. 7b shows a cross section whereby the FEBGA device 83 is mounted in a cavity that has for this purpose been provided in the heat sink 80. Device 83 is again surrounded by a plastic based encapsulant 84, bond wires 86 provide electrical contact between the device 83 and metal traces in the flex tape 81. The identification indentation or depression 85 is shown in the location where it is provided in accordance with the process of the invention.

Figure 7C:
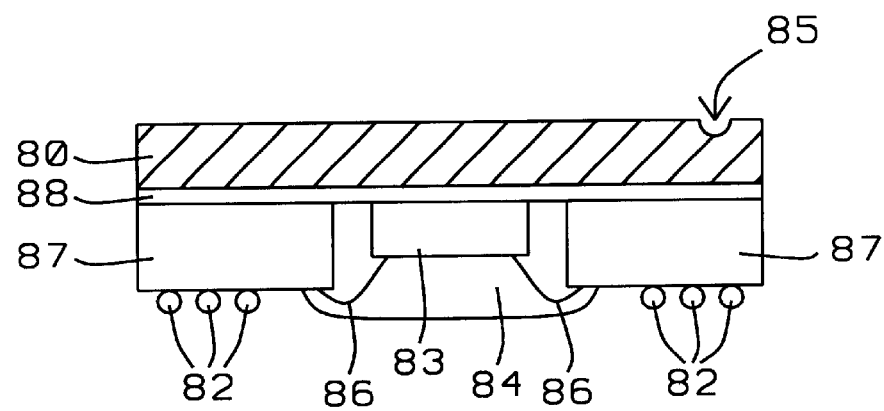

FIG. 7c is a cross section of a EBGA device 83 where the device is mounted on the surface of a heat spreader. Layer 88 is a layer of epoxy that from the interface between the substrate 87 and the heat sink 80. The orientation indentation or depression 85 is again shown in the location where it is affixed under the process of the invention.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of assembling a ball grid array assembly having a metal heatsink, comprising the steps of:

providing a square or rectangular shaped metal heat sink in addition to providing a square or rectangular shaped laminate substrate whereby said metal heat sink and said laminate substrate are aimed at packaging ball grid array devices whereby further said heat sink has a laminate substrate attach surface and a heat sink marking surface whereby further said laminate substrate has a heat sink attach surface and a die attach surface;

applying a layer of epoxy coat to said marking surface of said heat sink;

applying a first layer of adhesive to said heat sink attach surface of said laminated substrate;

attaching said heat sink to said laminate substrate by overlying said heat sink over said first layer of adhesive;

applying a second layer of adhesive to die attach surface of said laminate substrate;

providing a layer of interconnect tracings over said second layer of adhesive that has been applied to said laminate substrate said interconnect tracings having been provided with contact pads;

providing a solder mask over said layer of interconnect tracings;

inserting contact balls within said solder mask such that said solder balls overlay contact pads in said layer of interconnect tracings;

electrically connecting said contact balls with said contact pads in said layer of interconnect tracings by reflow of said contact balls;

encapsulating said ball grid array assembly thereby protecting said ball grid array assembly form environmental damage;

providing identification markings on said marking surface of said heat sink; and performing inspection of said ball grid array assembly.

2. The method if claim 1 wherein one or more laminate substrate identification marks have been provided overlying said layer of second adhesive coating whereby said laminate substrate identification marks are facing away from said square or rectangular shaped laminate substrate and are provided along a periphery of said layer of second adhesive coating preferably in one or more corners of said layer of second adhesive coating where said layer of second adhesive coating overlays said square or rectangular shaped laminate substrate.

3. The method of claim 1 wherein a indentation has been provided in said marking surface of said square or rectangular shaped heat sink whereby said indentation is preferably located at one or more corners of said square or rectangular shaped heat sink whereby said indentation is a removal of said heat sink material that penetrates said heat sink to a depth of between about 30 and 70% of the thickness of said square or rectangular shaped heat sink.

4. The method of claim 1 wherein said ball grid array assembly is preferably used for Flex Enhanced BGA (FEBGA) or Enhanced BGA (EBGA) devices.

5. The method of claim 1 wherein said heat sink attach surface of said heatsink and said marking surface of said heatsink have been black oxide plated.

6. The method of claim 1 wherein said a square or rectangular shaped heat sink contains copper.

7. The method of claim 1 wherein said layer of interconnect tracings over said second layer of adhesive that has been applied to said laminate substrate contain copper.

* * * * *

UNITED STATES PATENT AND TRADEMARK OFFICE
CERTIFICATE OF CORRECTION

PATENT NO. : 6,403,401 B1
DATED : June 11, 2002
INVENTOR(S) : Weddie Pacio Aquien, Loreto Y. Cantillep and Setho Sing Fee It is certified that error appears in the above-identified patent and that said Letters Patent is hereby corrected as shown below:

<u>Title page,</u>
Item [75], delete "Sg.", and replace with -- Singapore --.

Signed and Sealed this

Nineteenth Day of November, 2002

*Attest:*

*Attesting Officer*

JAMES E. ROGAN
*Director of the United States Patent and Trademark Office*

UNITED STATES PATENT AND TRADEMARK OFFICE
CERTIFICATE OF CORRECTION

PATENT NO. : 6,403,401 B1
DATED : June 11, 2002
INVENTOR(S) : Aquien et al.

It is certified that error appears in the above-identified patent and that said Letters Patent is hereby corrected as shown below:

Drawings,
Delete Figures 3a-3d, 5, 6a and 6b, and substitute therefore drawings consisting of Figs. 3a-3d, 5, 6a and 6b, as shown the attached pages.

Column 5,
Line 12, delete "FIG. 2 shows" and insert therefore -- FIGS. 2a and 2b show --
Line 42, delete "effects" and insert therefore -- affects --
Line 52, delete "FIG. 6" and insert therefore -- FIGS. 6a and 6b --

Column 6,
Line 67, delete ", and"

Column 7,
Lline 1, delete "." and insert therefore -- , and --
Line 2, insert (add line) -- 71, contact balls inserted in the solder mask 66. --
Formally line 2, newly numbered line 3, delete "FIG. 6 shows" and insert therefore -- FIGS. 6a and 6b show --

Signed and Sealed this

Twenty-fourth Day of August, 2004

JON W. DUDAS
*Director of the United States Patent and Trademark Office*

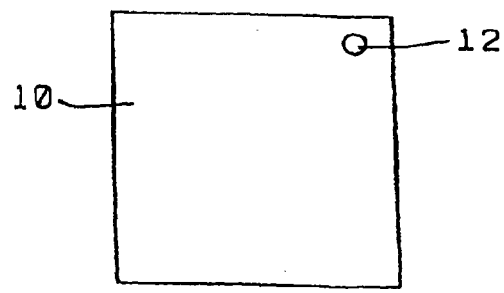
FIG. 3a
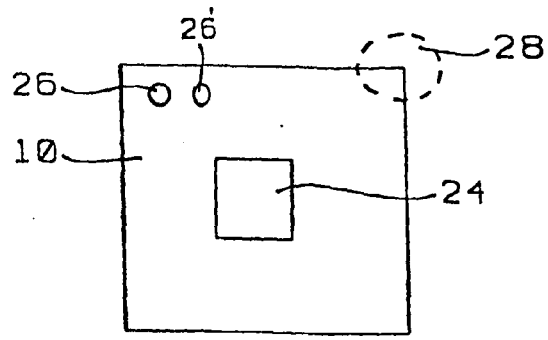
FIG. 3b – Prior Art
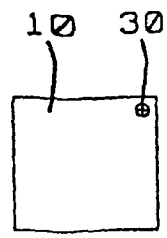 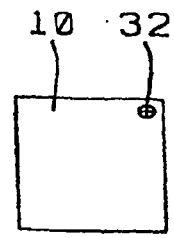
FIG. 3c – Prior Art
FIG. 3d – Prior Art

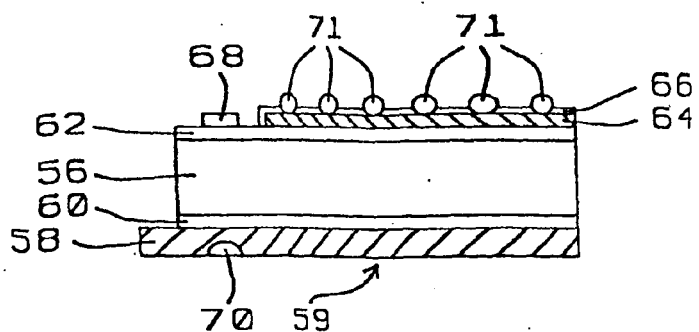
FIG. 5
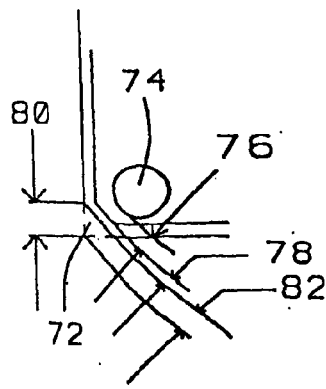
FIG. 6a - Prior Art
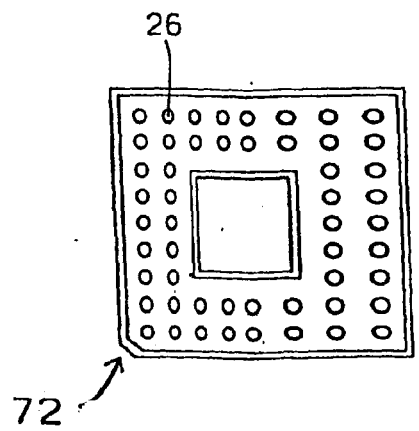
FIG. 6b - Prior Art